United States Patent
Chickering

(12) 
(10) Patent No.: US 6,249,796 B1
(45) Date of Patent: Jun. 19, 2001

(54) REAL-TIME TECHNIQUE FOR REDUCING THE SETTLING TIME OF A HIGH PASS FILTER

(75) Inventor: James Michael Chickering, Georgetown, MA (US)

(73) Assignee: Siemens Medical Systems, Inc., Iselin, NJ (US)

( * ) Notice: Subject to any disclaimer, the term of this patent is extended or adjusted under 35 U.S.C. 154(b) by 0 days.

(21) Appl. No.: 09/207,697

(22) Filed: Dec. 8, 1998

(51) Int. Cl.$^7$ ........................................... G06F 17/10
(52) U.S. Cl. ............................................... 708/300
(58) Field of Search ............................ 708/300–323, 708/3, 819

(56) References Cited

U.S. PATENT DOCUMENTS

| 4,542,475 | 9/1985 | Acampora | 364/724 |
|---|---|---|---|
| 4,875,106 | 10/1989 | Heitman | 358/314 |
| 5,388,221 | 2/1995 | Meitner et al. | 395/2.77 |
| 5,420,535 | 5/1995 | Nebuloni et al. | 330/51 |
| 5,740,096 | * 4/1998 | Shou et al. | 708/819 |
| 5,867,410 | * 2/1999 | Smallcombe et al. | 708/300 |
| 6,023,571 | * 2/2000 | Matsumoto et al. | 708/300 |

FOREIGN PATENT DOCUMENTS

| 195 18 528 | 1/1996 | (DE) . |
|---|---|---|
| 0 343 370 | 11/1989 | (EP) . |
| WO 94 23427 | 10/1994 | (WO) . |

* cited by examiner

Primary Examiner—Tan V. Mai
(74) Attorney, Agent, or Firm—Alexander J. Burke

(57) ABSTRACT

A technique for resetting a HPF for improving its settling time in response to a sharp transition in its input signal, by rapid input and clocking through the high-pass filter (HPF) of new data samples after occurrence of the sharp transition. The new data samples comprise an artificial ramp representative of the expected average slope of the input signal that should be maintained after occurrence of the sharp transition. The artificial ramp can be generated using "a priori" knowledge of the expected average slope of the input signal, or alternatively, can be generated using a direct measurement of the slope of the input signal at the time the HPF is to be reset. In the event that both the direct slope measurement and "a prior" slope knowledge are available at the time the HPF is to be reset, and they differ from each other, it is desirable to generate an artificial ramp whose slope provides a smoothed transition from the latter slope measurement to the former slope.

14 Claims, 6 Drawing Sheets

REAL-TIME TECHNIQUE FOR REDUCING THE SETTLING TIME OF A HIGH PASS FILTER

BACKGROUND OF THE INVENTION

1. Field of the Invention

The present invention relates to a technique for reducing the settling time of a high pass filter caused by sharp transitions in the filter input signal, and more particularly to a technique for quickly and accurately detecting a pulsatile signal component in a pressure signal produced by an automatic blood pressure gauge.

2. Description of the Prior Art

As noted above, the present invention is generally applicable to reducing the settling time of high pass filters used for detecting a low level pulsatile signal in the presence of a sharp transition in the input signal. However, for illustrative purposes the invention will now be described in a specific apparatus, namely, a non-invasive blood pressure (NIBP) measuring device. It should be kept in mind, however, that the invention is not limited to such a particular apparatus or use.

FIG. 1 illustrates a conventional automatic blood pressure gauge, which includes a resilient inflatable cuff 2 connected via a tube 4 to an electric pump 6. The cuff is placed about the arm of a patient (not shown) and the pump is controlled by a microprocessor 8 to inflate the cuff with a fluid, such as air, to a preset pressure. A deflation valve 9 is also connected to tube 4 and controlled by microprocessor 8 to deflate the cuff during the blood pressure measuring process. In addition, a pressure transducer 10 is connected to the cuff 2 via a tube 12, which measures instantaneous air pressure levels in the cuff. The electrical pressure signal produced by the transducer is applied to an analog to digital (A/D) converter 14 for digitization and then to microprocessor 8 for analysis to determine the instantaneous pressure of the cuff as well as for detecting the blood pressure pulses of the patient. Analysis of the pressure signal generally comprises band-pass filtering and processing by the microprocessor to detect the pulsatile component caused by the beating of the patient's heart, to produce values representing mean, systolic and diastolic blood pressure measurements of the patient. These values are then conveyed to the user of the NIBP device using, for example, a display 16

In operation, the cuff is affixed to the upper arm area (or other extremity) of the patient and then inflated to a pressure greater than the suspected systolic pressure, for example, 150 to 200 millimeters of mercury (mmHg). This pressure level collapses the main artery in the arm, effectively stopping any blood flow to the lower arm. Next, the cuff is slowly deflated and the electrical signal provided by the pressure transducer is analyzed to detect cuff pressure variations caused by the blood pressure pulses of the patient, where the pulses are mechanically coupled to the cuff. In general, the pulse component of the pressure signal has a relatively low amplitude, on the order of one percent of the total pressure signal, and is therefore somewhat difficult to quickly and accurately detect and measure.

Proper operation of the automatic blood gauge require s prompt and accurate detection and measurement of the low level pulsatile component of the cuff pressure signal. The microprocessor in the automatic blood pressure gauge typically executes an algorithm employing a high-pass filter (HPF) to extract from the average cuff pressure signal, the heart-rate pressure pulsations coupled to the cuff by the blood vessels in the patient's arm. In the embodiment illustrated herein, the filter is a 4th order Bessel filter with a −3 dB cut-off frequency of 0.75 Hz.

There are several points during the automatic measurement process where a sharp transition occurs in the average slope of the cuff pressure signal. These include the transition from the end of cuff inflation to the pressure-hold stage oust before the start of a slow deflation stage), and the pressure transition from the hold stage to the deflation stage.

FIG. 2 illustrates such a cuff pressure signal after it has been digitized at 50 samples per second, wherein the transition from the pressure-hold stage to the deflation stage occurs near time sample 820. Transitions such as these create a relatively large step-response (i.e., disturbance) in the output of the high-pass filter (HPF), which can take several seconds to settle out. The exact length of the settling time depends on the cut-off frequency of the HPF, with lower cut-off frequencies yielding longer settling times.

FIG. 3 illustrates the sampled pressure signal at the output of the HPF. As shown herein, the settling time effect causes distortion in the amplitude of legitimate pulses that appear at the output of the HPF after the occurrence of the transition, thereby delaying the accurate detection and measurement of the blood pressure of the patient. The distortion effect is at its maximum at time sample 831, and continues to about sample time 950 (note, the increasing amplitude of pulsatile components is representative of the cuff pressure approaching the mean arterial pressure of the patient).

Since the NIBP measurement process depends upon an accurate analysis of pulse amplitude, one approach to the problem of pressure transitions is to ignore the distorted pulses. However, measurement time is also an important consideration for NIBP gauges because blood perfusion is reduced to the limb during the measurement process.

Ideally, the effects of sharp transitions in the cuff pressure signal should be quickly removed from the output of the HPF so that the accurate measurement of the blood pressure pulses can recommence.

SUMMARY OF THE INVENTION

A method and apparatus to reset a digital HPF for improving its settling time in response to a sharp transition in its input signal, by rapid input and clocking through the HPF of new data samples after occurrence of the sharp transition. The new data samples comprise an artificial ramp representative of the average slope of the input signal that should be maintained after occurrence of the sharp transition. The artificial ramp can be generated using "a priori" knowledge of an expected average slope of the input signal, or alternatively, can be generated using an instantaneous measurement of the slope of the input signal at the time the HPF is to be reset.

In the event that "a priori" knowledge of the slope of the input signal is available, and the instantaneous measurement of the slope of the input signal at the time the HPF is to be reset differs therefrom, it is desirable to generate a ramp whose slope provides a smoothed transition from the latter slope measurement to the former slope, since an abrupt transition here can also create undesirable distortion effects.

DETAILED DESCRIPTION OF THE INVENTION

One approach to removing the effects of a sharp transition on the output of a high-pass filter (HPF) is to remove the transition from the HPF altogether. In order to do this in real-time, however, two pieces of information are required:

1. a trigger to indicate that such a transition has occurred in the HPF input signal, and
2. knowledge of the average slope that should be maintained (i.e., the expected slope) in the input signal after the transition. This knowledge of the expected slope can be either "a priori", or based on an instantaneous measurement of the slope of the input signal after occurrence of the sharp transition.

Figure 1:
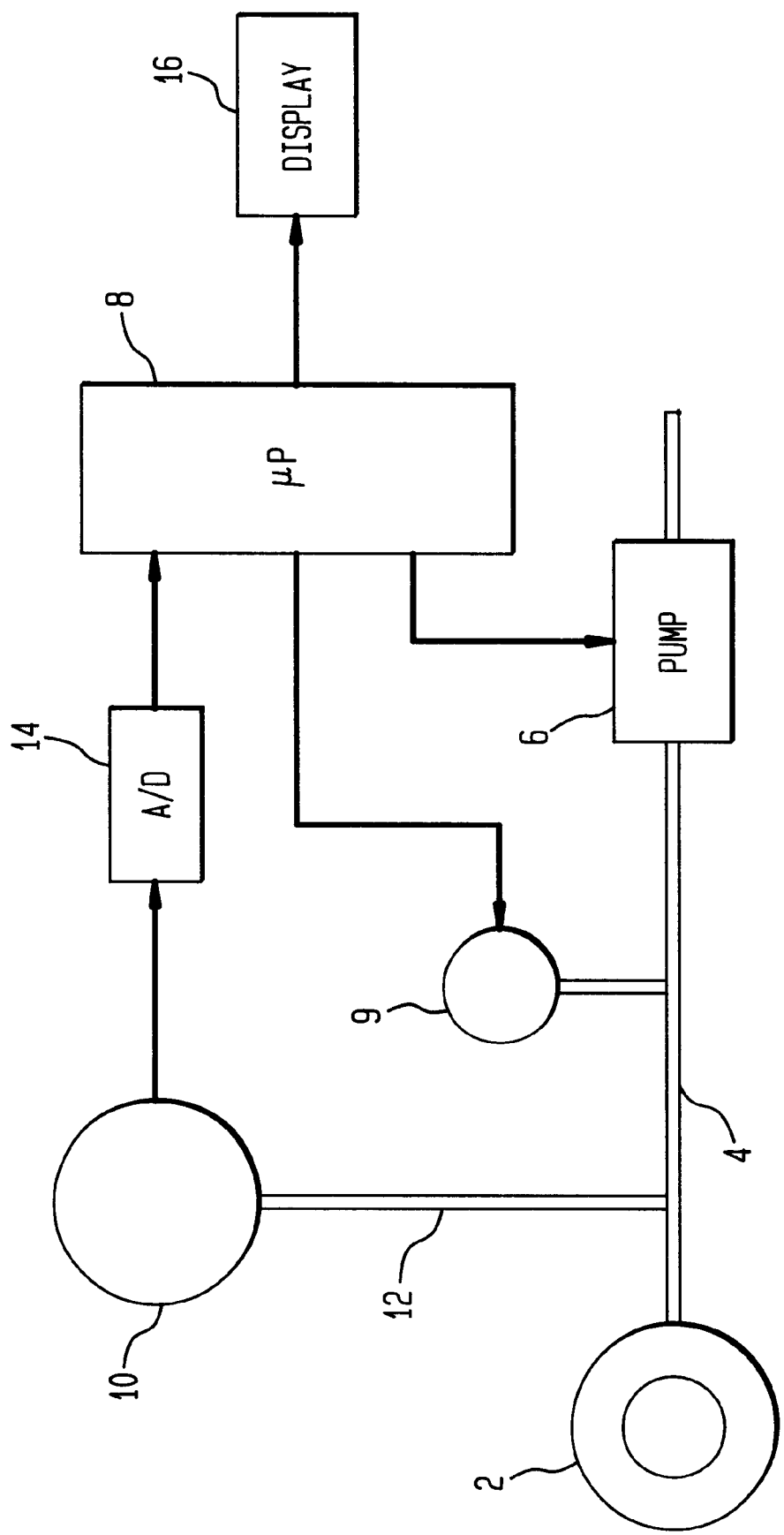
FIG. 1, previously described, is a block diagram of an automatic blood pressure gauge in which the present invention may be embodied.
Figure 2:
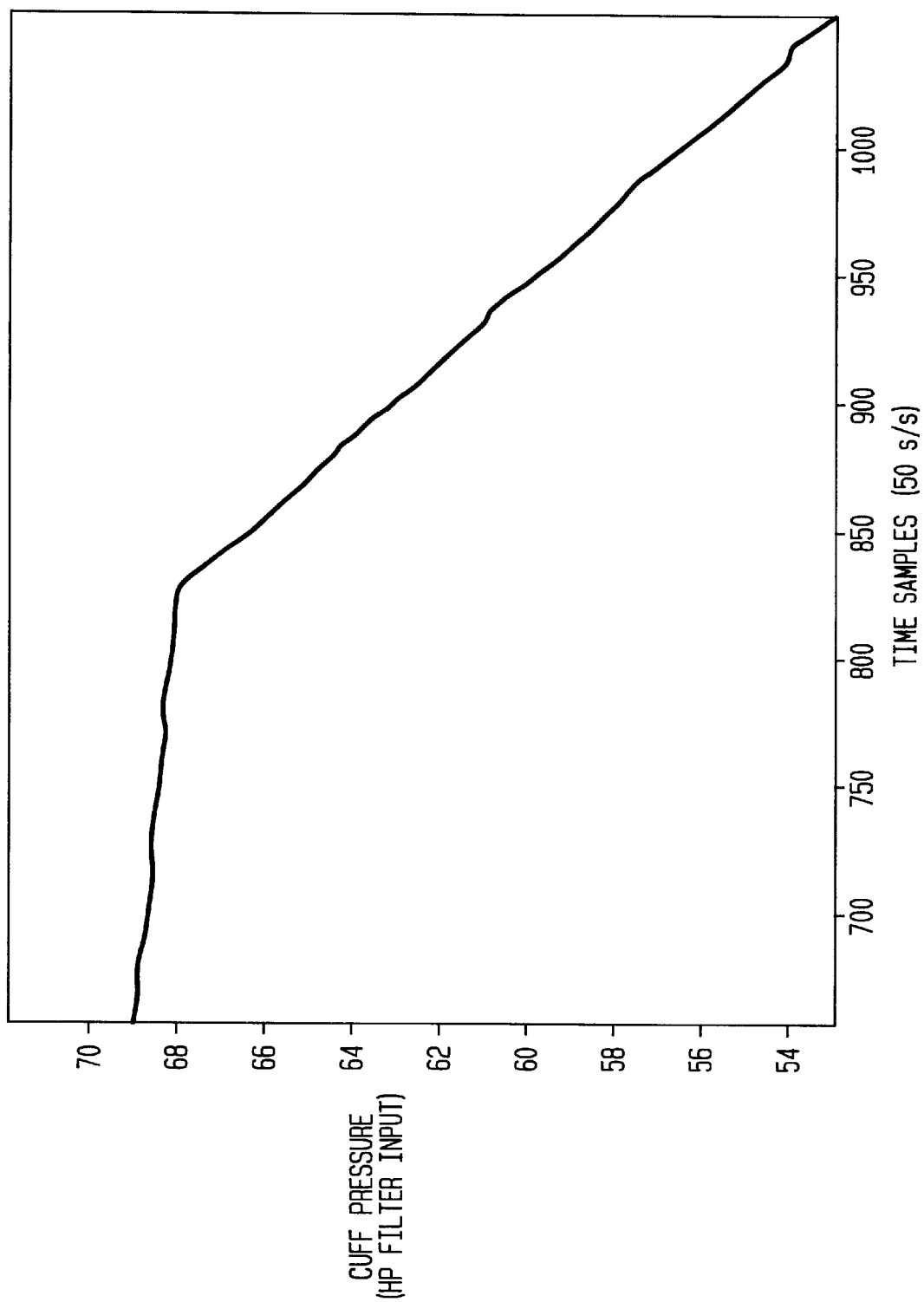
FIG. 2, previously described, illustrates the cuff pressure signal at the beginning of the typical cuff deflation stage of the automatic blood pressure gauge of FIG. 1.
Figure 3:
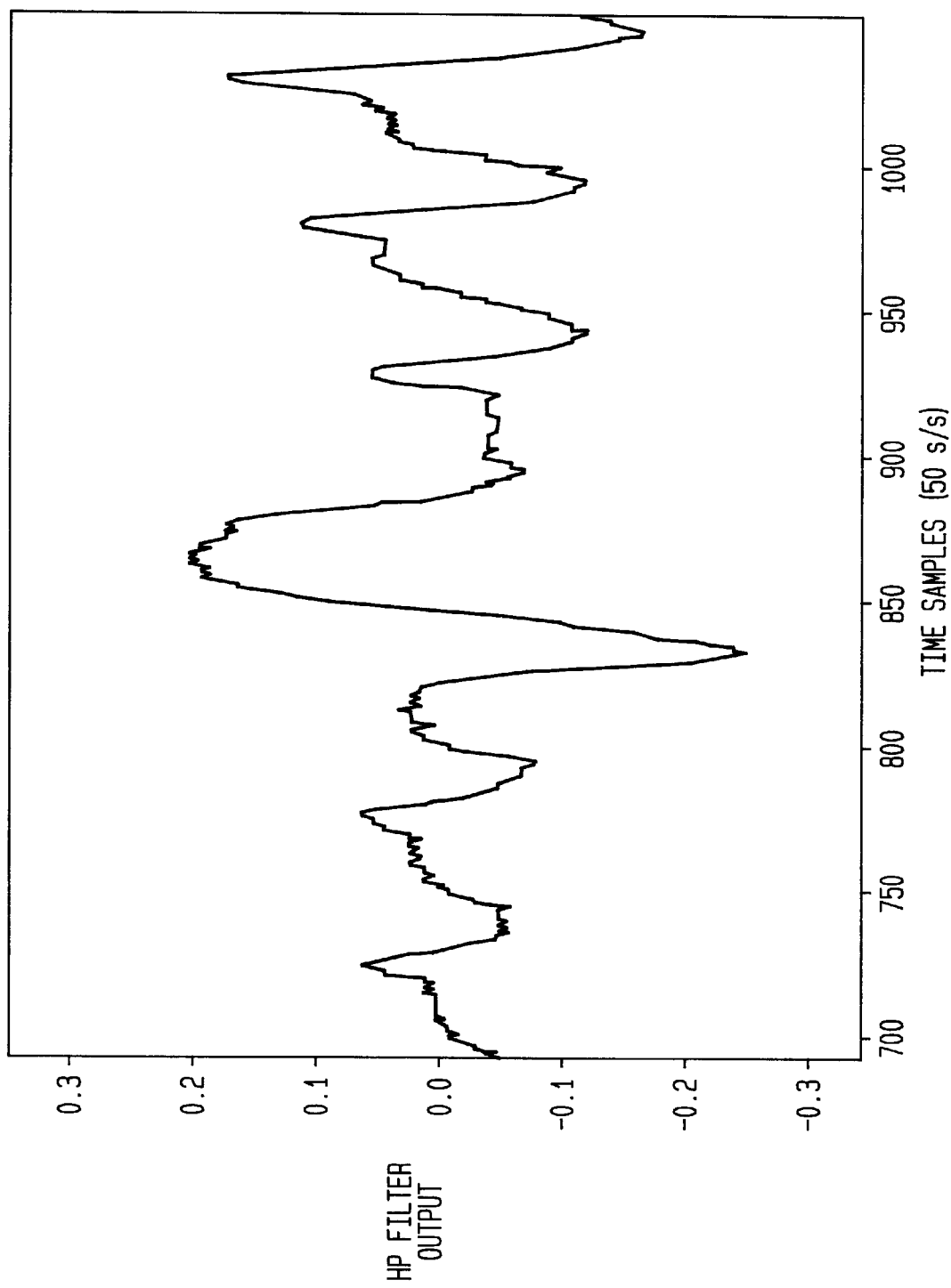
FIG. 3, previously described, illustrates the distortion effect in the pulsatile component of the measured blood pressure pulses due to the pressure transition shown in FIG. 2.

In the exemplary NIBP gauge illustrated in FIG. 1, and as shown by the pressure waveform of FIG. 2, the average slope of the pressure signal will either be 0 mmHg/sec during the pressure-hold stage or –4 mmHg/sec during the deflation stage. Given this "a priori" information, in accordance with one aspect of the invention, it is possible to construct artificial data for insertion into the filter input stream whose average slope is the same as the average slope that is expected to occur after the sharp transition. Next, digital samples representative of this artificial ramp are concatenated to a given filter input sample that occurs at a point after the transition, and then the artificial ramp is rapidly clocked (i.e., advanced) through the filter. This rapid clocking advantageously takes place between two regularly occurring sample clock times and continues up to and including the given input sample. The rapid clocking effectively purges the energy relating to the sharp transition from the filter output.

Figure 4:
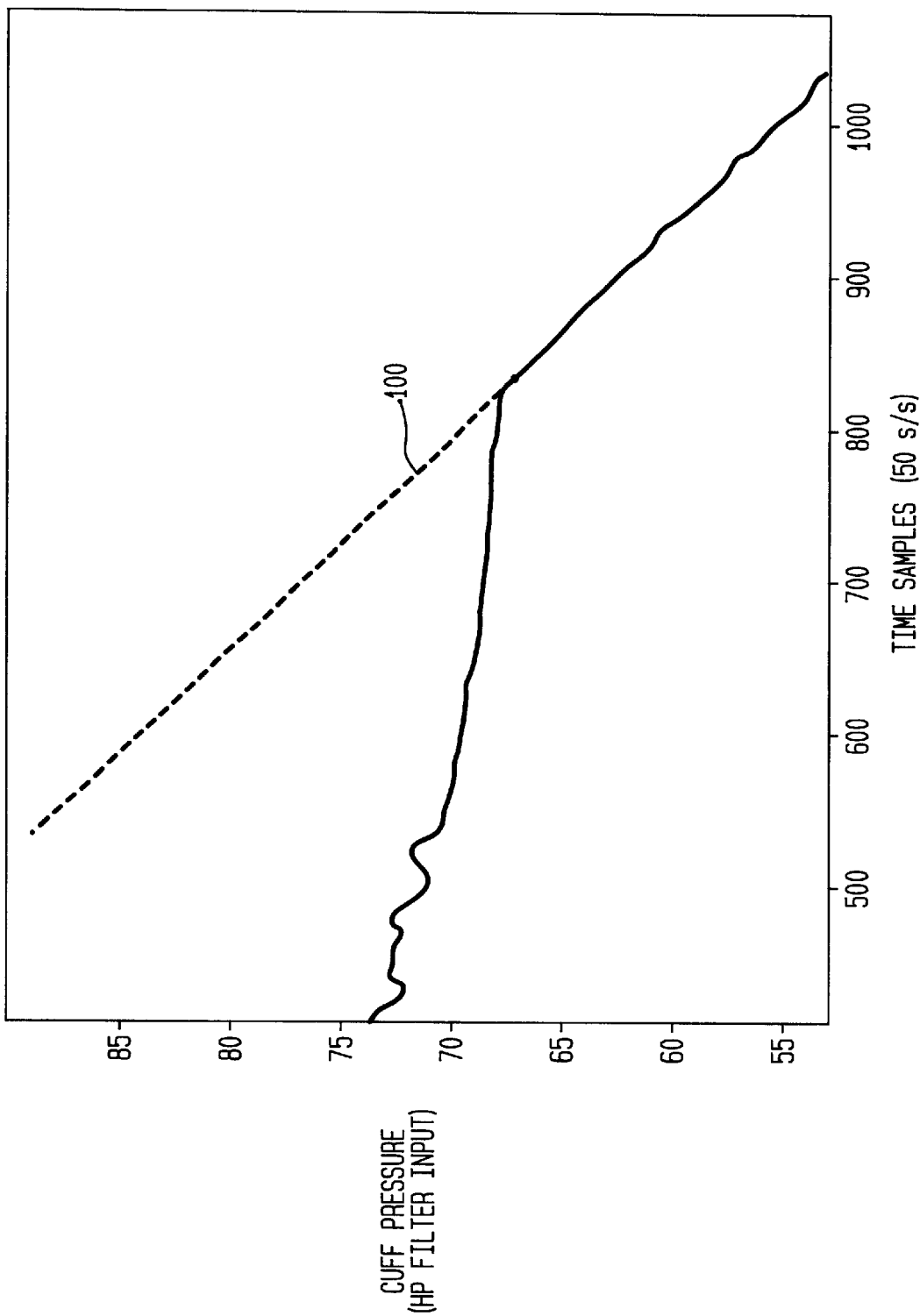
FIG. 4 illustrates a ramp signal generated in accordance with one aspect of the present invention.

FIG. 4 illustrates an artificial ramp (dashed line 400) that was generated in accordance with the present invention and used to reset the high-pass filter just after time sample 831. In the illustrated embodiment, due to the electro/mechanical delays inherent in the NIBP system (pump, cuff, deflate valve and transducer), the filter is not reset until just after sample time 831 in order to insure that the sharp transition in the cuff pressure signal has fully occurred. The filter then advances (i.e., clocks) all of the data samples of this artificial ramp through to its output between two adjacent ones of the 50 samples/second samples of the input signal (i.e., between samples 831 and 832). As such, the filter is ready to process the next 50 samples/second sampled data point (i.e., sample 832) in realtime and the distortion effects relating to the sharp transition have been purged from the filter.

Figure 5:
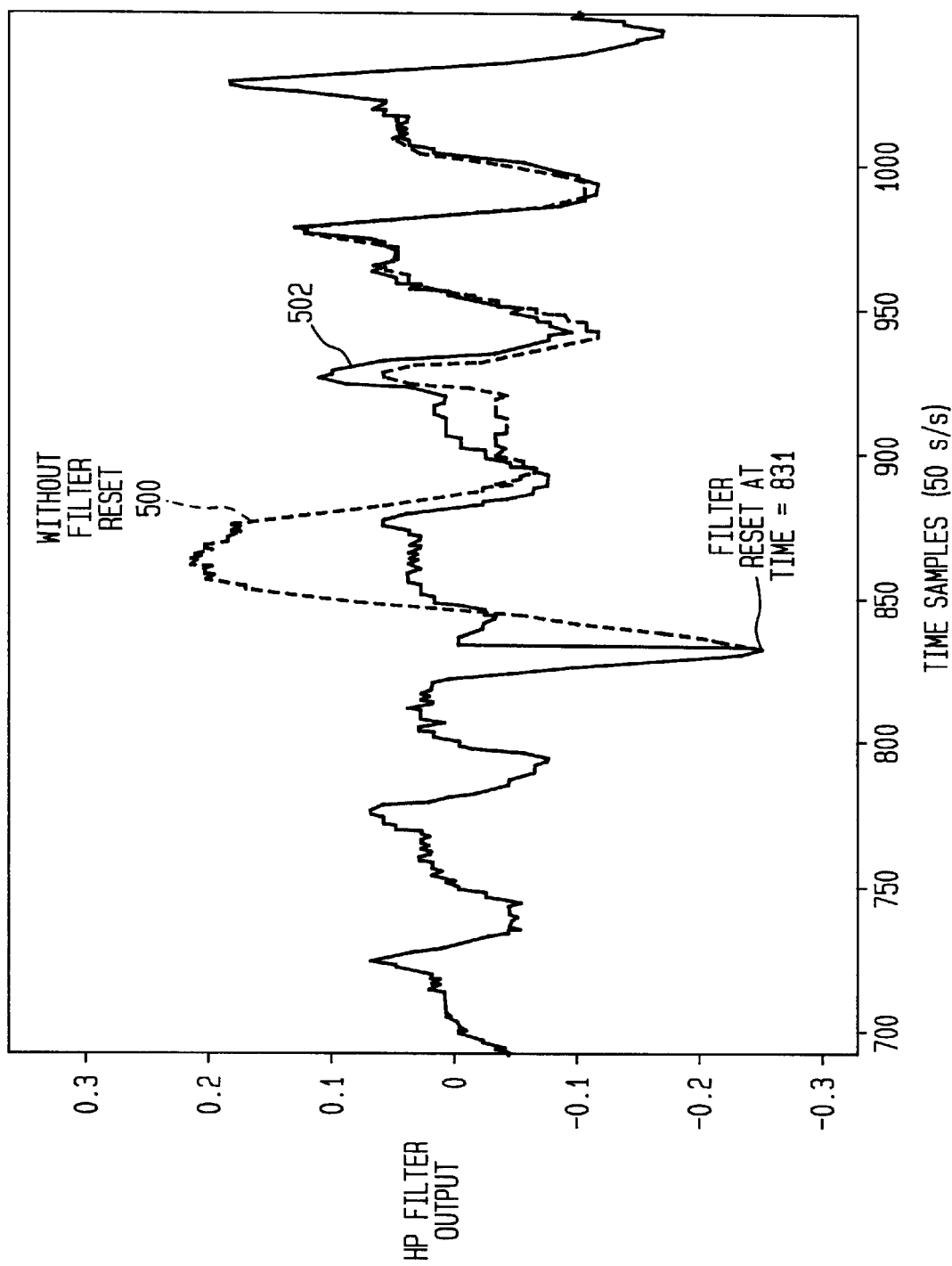
FIG. 5 illustrates the reduced distortion effect in the HPF output signal when the HPF is reset with the ramp of FIG. 4.

In FIG. 5 a dashed-line waveform 500 illustrates the output of the filter without use of the inventive filter reset scheme, while a solid-line waveform 502 illustrates the improvement when using the filter reset scheme of the invention.

Several factors should be considered when generating the artificial ramp. Firstly, the artificial ramp must be long enough, i.e., have enough samples, to allow time for the filter to settle out from the impulse that may occur when the first sample of the ramp is fed into the filter, which may comprise a sharp transition in its own right. The minimum length of the ramp depends upon the settling time of the particular filter being used. Secondly, the transition from the artificial ramp to the latest filter input samples also need consideration. This is because in the exemplary embodiment, an instantaneous measurement of the slope of the sampled cuff pressure signal is also used, which can deviate significantly from the expected average slope due to the blood pressure pulsations. In accordance with a further aspect of the invention, a smooth transition is created from the ramp's slope to the instantaneous slope associated with the last signal sample occurring before the reset point. Otherwise, a sharp transition could be introduced into the signal.

A smooth ramp transition can be achieved by slowly converting the instantaneous slope measured at the last signal sample before the reset, to the expected ramp slope, using a weighted average scheme, and then constructing the ramp backward in time from the last signal sample. In this way, the ramp transition, if any, will appear more like a pulse, rather than a sharp edge, to the high-pass filter.

Figure 6:
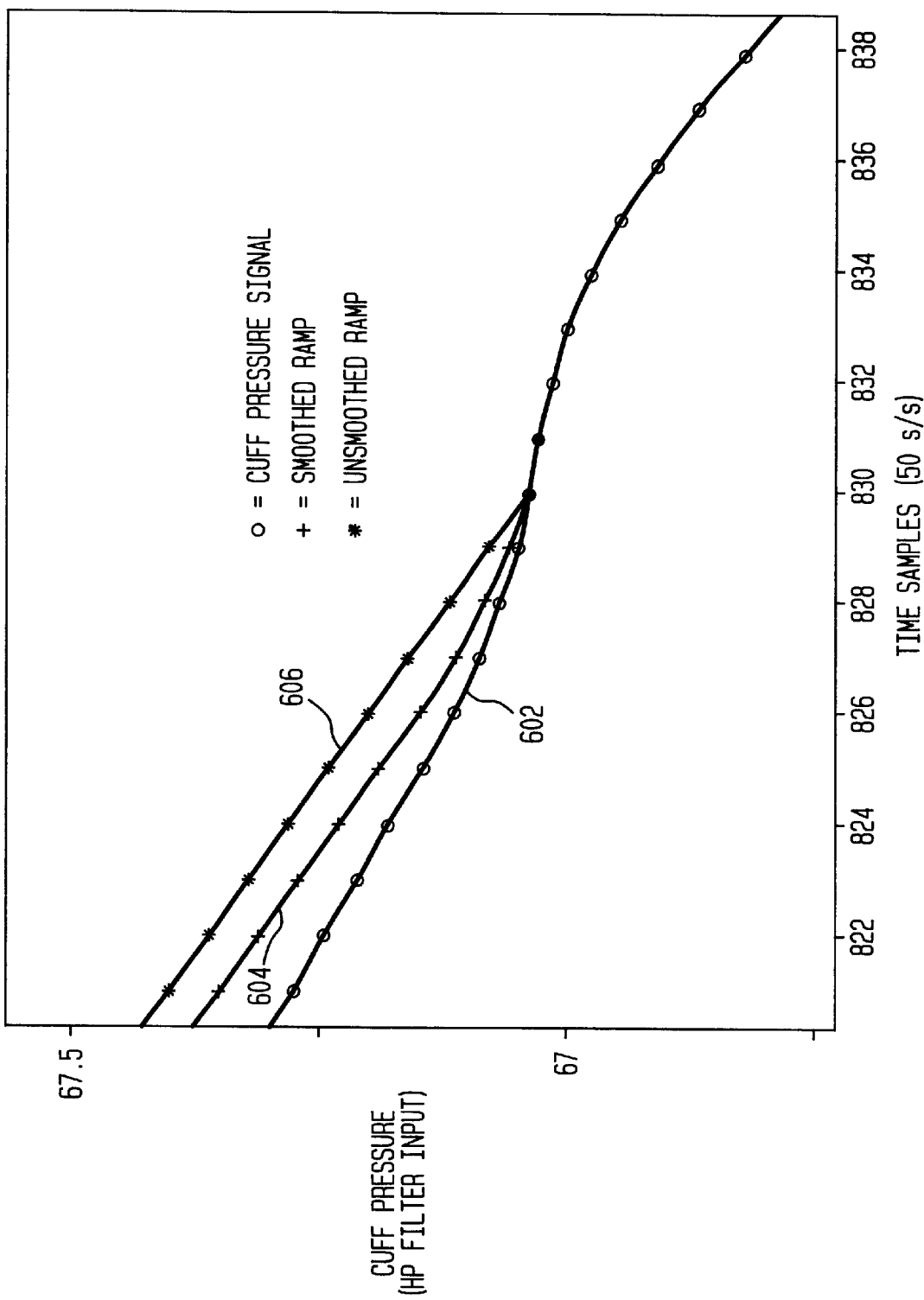
FIG. 6 illustrates the generation of a smoothed transition ramp in accordance with a further aspect of the present invention.

This process is illustrated in FIG. 6, which shows details of a cuff pressure signal 602 at the point where a blood pressure pulsation is occurring during deflation. Notice that the slope of the cuff pressure signal is varying due to the presence of the pulsation. In this illustration, it is desired to reset the high-pass filter just after time sample 831 in response to a sharp transition known to occur in the cuff pressure signal several hundred milliseconds earlier (i.e., at time sample 820). Note, time samples 832 and beyond are shown for perspective only, and they would have not yet been sampled when the filter was reset just after time sample 831. The slope between time samples 830 and 831 is the instantaneous slope mentioned earlier and the artificial ramp would be connected to time sample 830. Note, FIG. 6 shows both a smoothed ramp transition 604 and unsmoothed ramp transition 606. In accordance with a second aspect of invention, the smoothed ramp transition 604 is rapidly advanced (i.e., clocked) into the high-pass filter up to and including time sample 831, thereby greatly reducing the effects of the transition from appearing in the filter output. Note, since the system knows when the transition occurs (i.e., at sample time 820), and when the filter is being reset (i.e., just after sample time 831), the microprocessor will ignore the filter output between these times. Also, depending on the system response time, it is noted that the HPF filter reset could occur at sample times other than just after 831, for example, just after sample time 825 if the sharp transition would have been completed by that time.

By insuring a smooth transition in the manner described, this process can be applied at any time regardless of the instantaneous slope of the signal at the time that the filter reset is desired.

Given the above-mentioned factors, the artificial ramp is created by the following process for the exemplary NIBP apparatus where a priori slope knowledge is available:

1. measure the difference between the latest two filter input samples of the cuff pressure signal at the time when the filter reset is to be initiated. This difference is the "instantaneous slope" in mmHg/sample.
2. convert the ramp slope from mmHg/sec to mmHg/sample. (The expected ramp slope is the average slope that will be maintained after the transition occurred in the input signal.)
3. construct a ramp backwards in time using the two latest filter input samples as the end points of the ramp. The preceding samples of the ramp are created using a sample-to-sample deflation slope that gradually migrates from the measured instantaneous slope to the expected ramp slope, by means of a weighted average calculated as follows:

$$I = 300$$
$$RampSlope_i = InstantaneousSlope$$
$$RampSlope_{i-1} = \frac{(3 \times RampSlope_i + RampSlope_{Expected})}{4}$$

After several samples, the ramp's slope will converge on the expected slope and will remain there for the majority of the samples in the ramp.

4. When the ramp is 300 samples in length (6 seconds of clocking the HPF at its normal rate), it is completed.

Thus, there has been shown and described a novel method and apparatus for reducing the settling time of an HPF. Many changes, modifications, variations and other uses and applications of the subject invention will, however, become apparent to those skilled in the art after considering this specification and it's accompanying drawings, which disclose preferred embodiments thereof. For example, the time constant of the above equation was shown to work well for the exemplary NIBP application. However, the important point to remember is to create a smooth transition from the latest input samples to the artificial ramp, by means that are appropriate for the characteristics of the filter. Also, a 6 second ramp works well for the NIBP application, but may vary for other applications based on filter settling time. Additionally, it may be necessary to clamp the instantaneous slope before it is fed into the above equation, if it can be unusually large, otherwise the resulting transition from ramp to latest signal samples could appear as a large impulse to the filter. For the NIBP application, this is not a problem. Furthermore, although this approach has been tailored to the NIBP application, it would generally apply to any digitized HPF input signal where the average future slope is known or measurable at the point in time when the filter reset is desired. Note, although in the illustrated embodiment an instantaneous measurement of slope is used, depending upon the users application, an average slope over several previous samples could also be used. This technique could also be used to recover from a step change in the slope of an input signal. Furthermore, although the HPF of the illustrated embodiment is accomplished in software by microprocessor 8, it could also be accomplished using a hardware embodiment. All such changes, modifications, variations and other uses and applications which do not depart from the teachings herein are deemed to be covered by this patent, which is limited only by the claims which follow as interpreted in light of the foregoing description.

What is claimed is:

1. A method for reducing the settling time of a digital high-pass filter (HPF) in response to a sharp transition in an input signal applied to an input of the HPF, comprising the following steps:

determining an HPF reset time point based upon the existence of a sharp transition in the input signal;

generating an artificial ramp signal based upon knowledge of the average slope of the input signal that should be maintained after occurrence of the sharp transition in the input signal; and applying said artificial ramp signal to said HPF input at said reset time point; and rapidly advancing said artificial ramp signal through said HPF, thereby purging the sharp transition from said HPF.

2. The method of claim 1, wherein said digital filter advances digital samples of said input signal therethrough at a given clock rate, and said artificial ramp signal is generated so as to have a number of samples, i.e., length, corresponding to at least the settling time of the HPF.

3. The method of claim 2, wherein said rapid advancing of said ramp signal corresponds to clocking all of the data samples that comprise the artificial ramp through said HPF.

4. The method of claim 1, wherein said HPF reset time point is determined based upon a priori knowledge of the time when a sharp transition will occur in the HPF input signal, and corresponds to a point in said input signal after occurrence of said sharp transition.

5. The method of claim 4, wherein said artificial ramp signal is generated based upon a priori knowledge of the average slope of the input signal that should be maintained after occurrence of the sharp transition.

6. The method of claim 4, wherein said artificial ramp signal is generated based upon a direct measurement of the slope of the input signal just prior to the reset time point.

7. The method of claim 6, wherein the direct measurement comprises an average slope taken over several samples of the input signal.

8. The method of claim 6, wherein the direct measurement comprises an instantaneous measurement of the slope of the input signal just prior to the reset time point.

9. The method of claim 6, wherein said artificial ramp signal is generated by creating a smoothed transition from the measured value to an a priori known average slope that should be maintained in the input signal after occurrence of the sharp transition.

10. The method of claim 9, wherein said smoothed transition is created by means of a weighted average, calculated as follows:

$$I = 300$$
$$RampSlope_i = InstantaneousSlope$$
$$RampSlope_{i-1} = \frac{(3 X RampSlope_i + RampSlope_{Expected})}{4}.$$

11. Apparatus for reducing the settling time of a digital high-pass filter (HPF) in response to a sharp transition in an input signal applied to an input of the HPF, said apparatus comprising:
   a processor, said processor performing
      a first function of determining an HPF reset time point based upon the existence of a sharp transition in the input signal;
      a second function of generating an artificial ramp signal based upon knowledge of the average slope of the input signal that should be maintained after occurrence of the sharp transition in the input signal; and
      a third function of applying and rapidly advancing said artificial ramp signal through said HPF at said reset time point, thereby purging the sharp transition from said HPF.

12. The apparatus of claim 11, wherein said processor is responsive to said input signal for detecting occurrence of said sharp transition in the HPF input signal for use in determining the HPF reset time point.

13. The apparatus of claim 11, wherein said processor makes an instantaneous measurement of the slope of the input signal just prior to the reset time point, for acquiring the knowledge of the average slope of the input signal for generating the artificial ramp signal.

14. The apparatus of claim 11, wherein said processor creates a smoothed transition from the instantaneously measured value to an a priori known average slope that should be maintained in the input signal after occurrence of the sharp transition when generating the artificial ramp signal.

* * * * *